(12) United States Patent
Kahl et al.

(10) Patent No.: US 6,329,014 B1
(45) Date of Patent: Dec. 11, 2001

(54) PROCESS FOR PRODUCING A CASING PROVIDING A SCREEN AGAINST ELECTROMAGNETIC RADIATION

(75) Inventors: Helmut Kahl, Berlin; Bernd Tiburtius, Kleinmachnow, both of (DE)

(73) Assignee: EMI-TEC Elektronische Materilien GmbH, Berlin (DE)

( * ) Notice: Subject to any disclaimer, the term of this patent is extended or adjusted under 35 U.S.C. 154(b) by 0 days.

(21) Appl. No.: 09/393,907

(22) Filed: Mar. 10, 1999

Related U.S. Application Data

(63) Continuation of application No. 08/820,936, filed on Mar. 19, 1997, now Pat. No. 5,882,729, which is a continuation of application No. 08/208,626, filed on Mar. 9, 1994, now abandoned.

(30) Foreign Application Priority Data

Jun. 14, 1993 (DE) .................................................. 43 19 965

(51) Int. Cl.$^7$ ....................................................... B05D 5/12
(52) U.S. Cl. ............................ 427/58; 427/123; 427/265; 427/284; 427/385.5
(58) Field of Search ............................... 427/58, 122, 123, 427/265, 284, 385.5

(56) References Cited

U.S. PATENT DOCUMENTS

| | | |
|---|---|---|
| 3,140,342 | 7/1964 | Ehrreicm et al. . |
| 3,627,337 | 12/1971 | Pippert . |
| 3,885,701 | 5/1975 | Becklin . |
| 4,011,360 | 3/1977 | Walsh . |
| 4,157,149 | 6/1979 | Moen .................................... 222/486 |
| 4,326,238 | 4/1982 | Takeda et al. ........................ 361/386 |
| 4,399,317 | 8/1983 | Van Dyk, Jr. ............................ 174/35 |
| 4,625,979 | 12/1986 | Inciong ................................. 277/180 |
| 4,643,864 * | 2/1987 | Martini ................................. 264/220 |
| 4,659,869 | 4/1987 | Busby . |
| 4,756,784 | 7/1988 | Jones et al. ........................... 156/157 |
| 4,931,479 | 6/1990 | Morgan . |
| 4,964,362 | 10/1990 | Dominguez ......................... 118/315 |
| 4,969,653 | 11/1990 | Breen . |
| 4,977,295 | 12/1990 | Chin et al. . |
| 4,980,516 * | 12/1990 | Nakagawa ........................ 174/35 GC |
| 4,993,723 | 2/1991 | Sroka et al. ........................... 277/180 |
| 5,045,635 | 9/1991 | Kaplo et al. ............................. 174/35 |
| 5,089,190 * | 2/1992 | Trevathan et al. ................... 264/45.9 |
| 5,099,090 | 3/1992 | Allan et al. . |
| 5,284,888 * | 2/1994 | Morgan ................................. 524/93 |
| 5,326,611 | 7/1994 | Kishua et al. . |
| 5,882,729 * | 3/1999 | Kahl et al. ............................ 427/265 |

FOREIGN PATENT DOCUMENTS

| | | |
|---|---|---|
| 182391 * | 5/1986 | (EP) . |
| 0241192 | 10/1987 | (EP) . |
| 241192 * | 10/1987 | (EP) . |

OTHER PUBLICATIONS

Prof. Dipl.–Ing. Rudolf Sautter "Numerische Steuerugen fur Werkzeugmaschien", No Date Available.

Emerson & Cuming, Inc., Conductive Plastic EMI/RFI Gaskets, No Date Available.

(List continued on next page.)

Primary Examiner—Brian K. Talbot
(74) Attorney, Agent, or Firm—Gottlieb, Rackman & Reisman P.C.

(57) ABSTRACT

A process for producing a casing acting as a screen against electromagnetic radiation, more particularly intended for electronic operational elements, comprising a screening profile arranged in a predetermined portion of at least one part of the casing, said screening profile being made of elastic, conductive material, the elastic, conductive material being applied, by means of pressure from a needle or nozzle, directly onto the portion of the casing part, on which the screening profile is to be arranged, and a casing produced according to said process.

18 Claims, 3 Drawing Sheets

OTHER PUBLICATIONS

M. Hansmann, Braunschweig, "LaserstrahlscheiBen in der Feinmerchanik", No Date Available.

Baumberger, Beat: Polyurethan Schaumstoffe im Einstaz bei direkt geschaumenten Dichungen, Spuhl AG, Publication, Jan. 1984.

Blaha, Hans J.: Kleben, Schaumen und GieBen—CNC–gesteuert. In: Technische Rundschau, 36/1988, No Month Available.

Blaha, Hans: Produktionsverfahren der Zukunft. In: Adhasion, Issue 3, 1992, No Month Available.

King, Geoffrey D.: Improved Foan in Place Gasketing Material. In: SAE Technical Paper Series, 1990, No Month Available.

Messina, Michelle E.: Automated Dispenser Increases Production and Reduces Rework. In: Adhesives Age, Oct., 1990.

Moser, K.: Automatisierter Auftrag von Dichtschnuren aus Zweikomponenten–Dichtungsschaum. In: Kunststoffe, Issue 8, pp. 402, 403, 1983, No Month Available, A–600 Dispensepro. Asymetek, Brochure, Aug. /1991.

A–600 Dispensepro. Asymetek, Brochure, 8/1991.

Automatisches Dosiersystem DispenseMate von Asymtek im Vertrieb bei GLT. GLT Gesellschaft fur Lottechnik mbH. Brochure, No Date Available.

Chomerics Technical Bulletin #46. Chomerics Inc., Brochure, 1987, No Month Available.

Chomerics Technical Bulletin #46. Chomerics Europe Ltd., Brochure, 1990, No Month Available.

Dispensing System for Cured–in–Place Gasketing. In: Adhesives Age, Nov. 1991.

Dynafoam Technical Guide, Norton Performance Plastics Corporation, Brochure, Mar. 1992.

EMI/RFI Gasket Design Manual. Chomerics Inc., Brochure, 1975, No Month Available.

Freiprogrammierbare Auftrags–und VerauBsyteme, Hilger u. Kern, Brochure, Oct. /1986.

Gieben, Kleben, Schaumen. Hugo Kern und Liebers GmbH & Co., Brochure, 1985, No Month Available.

Low cost robot is easily programmed. In: Reinforced Plastics, p. 80, Mar. 1985.

MDA Mikro–Dosier–und Automatisierungstechnik. Bartec, Brochure, No Date Available.

Netsch–Mohno–Robo–Dosier. Netzsch Mohnopumpen GmbH, Brochure, 1988, No Month Available.

Silicone Adhesive/Sealant. In: Adhesives Age, Mar. 1991.

Silver–Filled Flexible Resin Caulking system. Technit EMI Shielding Products, Brochure, 1981, No Month Available.

Sphul. In: PLASTverarbeiter, p. 76, 1985, No Month Available.

Take advantage of the most advanced PUR sealing technology...Spuhl Ltd., Brochure, Jun. 20, 1985.

M. Kumadar T. Wada–Recent Silicon Techniques–Development and Application, pp. 185, 191, 192, 195–197, published by K.K.S.M.G. –Sep. 25, 1986.

Tecknit –Conductive Caulking Systems Data Sheet CS–723 (1972), No Month Available.

Altofle Brochure, No Month Available.

Tecknit Catalog 8565–1790, No Month Available.

Dopag Catalog–1992, No Month Available.

EFD Catalog–1992, NO Month Available.

Freiprogrammierbara Auftrags–und VerguBsysteme–1986, No Month Available.

Paul Ivanfi, "Verarbeitung von Einund Mehrkomponenten–Kleb–und Dichtstoffen", No Date Available.

Von Dipl.–Phys. Manfred Hof, Waldbronn b. Karisruhe, "Klebectechniken in der Mikroelektronik",No Date Available.

NEMRO–Robo–Dispenser, Memo Pumpen, No Date Available.

* cited by examiner

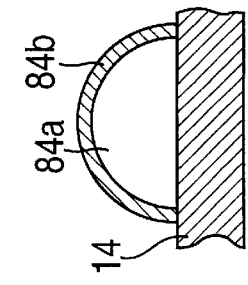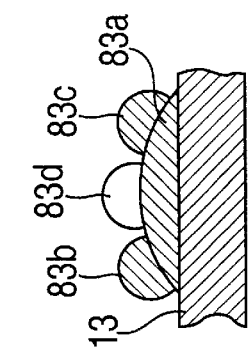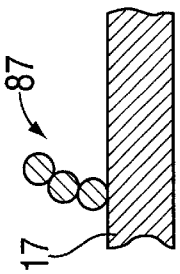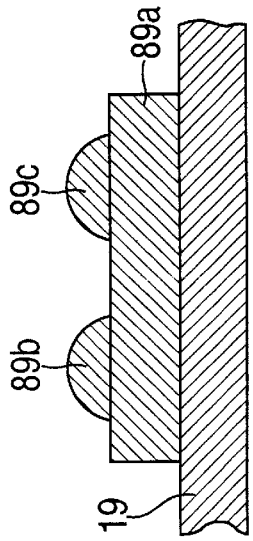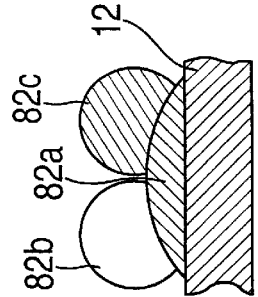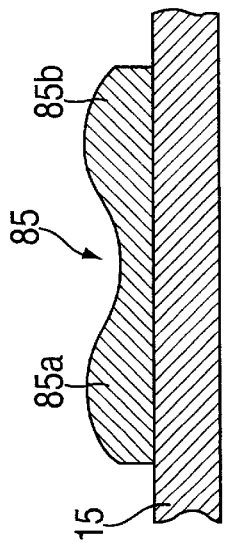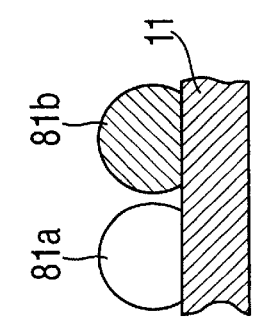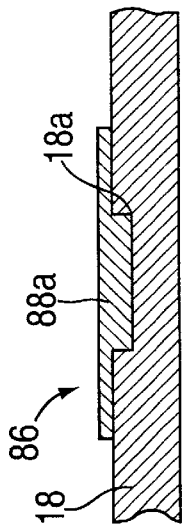

PROCESS FOR PRODUCING A CASING PROVIDING A SCREEN AGAINST ELECTROMAGNETIC RADIATION

This is a continuation to application Ser. No. 08/820,936, filed Mar. 19, 1997 now U.S. Pat. No. 5,882,729, which is a continuation of application Ser. No. 08/208,626 filed Mar. 9, 1994, now abandoned.

BACKGROUND OF THE INVENTION

1. Field of the Invention

The invention relates to a process for producing a casing providing a screen against electromagnetic radiation according to the preamble of claim 1, and a casing according to the preamble of claim 6.

2. Description of the Prior Art

Electronic components and also measuring, detection and similar devices sensitive to interference by electromagnetic radiation require a screen against the electromagnetic fields present at the operational site in order to ensure a problem free operation.

They are therefore accommodated in screening cases which comprise conductive material in the walls and act as a Faraday cage.

Such casings are also used for equipment or components which, themselves, emit electromagnetic rays that must be excluded from the environment, in order for example, to prevent the emission of secret information or the malfunction of external appliances.

Today such a screening against the emission or irradiation of EMI must be more effective the more electronic apparatuses are operated and the greater the proximity at which these apparatuses must operate next to each other. Finally, the continuous increase in performance and sensitivity of such equipment also necessitates an improvement of the screening measures for which increasingly less space is available, since the relevant appliances must, moreover, be miniaturised. Thus, apart from the actual operational properties of electronic appliances, the "electromagnetic compatibility" is today a significant factor determining quality.

If, as is mostly the case in practice, the casings are multi-part constructions which must be capable of being opened occasionally (e.g. in order to renew the energy source or for maintenance purposes), it is necessary to provide the parts of the casing to be separated from each other during opening and to be reconnected again during closing, with elastic conductive seals in order to achieve an effective screening.

Whilst, on the one hand, spring-like metal seals are known for this purpose, they are, however, comparatively expensive to construct and their operability may be greatly affected by oxidation and soiling.

Furthermore, resilient sealing profiles made of elastomer which is conductive or has been made conductive, which has been mixed with carbon or metal particles in order to make it conductive, are known from e.g. U.S. Pat. No. 4,659,869 or DE-OS 28 27 676.

Such sealing profiles are normally manufactured as separate seals. They may be moulded or extruded as a continuous section and then placed into the casing to be screened.

This is a labour-intensive operation and especially in small casings it causes difficulties as seals with correspondingly small dimensions are difficult to handle. The provision of suitable guides (grooves) which facilitate the mounting on the casing requires an unreasonable amount of space and is thus a hindrance to the further miniaturisation of the appliances.

Intricately moulded seals likely to be needed for special casings require specific positioning equipment which makes the manufacture of the casing altogether more expensive. The exact positioning is, moreover, time-consuming and necessitates additional inspection.

The hot-moulding, in moulds, of such screening profiles onto the relevant casing portions or parts and the setting at a relatively high temperature and/or high pressure is also known.

This process cannot be used with parts sensitive to pressure and/or temperature such as printed circuit boards or metallised plastics casings and, as a result of the low tear resistance of the related materials, problems arise during the removal from the mould resulting in a relatively high number of rejects and, more particularly in intricately shaped casings and seals, also frequently necessitating time-consuming and labour-intensive machining on the pressed-out edges.

SUMMARY OF THE INVENTION

The invention has the object of providing a process of the above kind for producing protective screens, more particularly within the region of casing joints, which may be adapted, in a simple manner, to the most varied requirements, even in a miniaturised construction. It must also be possible to use the process according to the invention for casings to be produced in larger quantities, in a simple manner and at low cost. The casing produced according to this process must be provided with a screening profile which meets the electromagnetic and mechanical requirements and remains in good condition even after a repeated opening of the casing.

This object is achieved by a casing with the features of claim 6 or a process with the features of claim 1.

The invention is based on the concept of not producing the screening profile separately but directly and without using a mould on the casing, by means of a hardening pasty or liquid compound with the required properties which issues from an opening guided over the geometrical extent to be sealed, thereby avoiding any problems in handling, on the one hand, and the process-related disadvantages of compression moulding, on the other hand. Here, the material consists of a plastics compound which contains conductive inclusions, more particularly in the form of metal or carbon particles.

If, for forming the profile, the guidance of the needle or nozzle over the portion of the casing part, on which the screening profile is intended to be mounted, is done by machine, more particularly controlled by computer, a high precision and great flexibility is ensured in shaping the profile so that moreover intricately moulded casings or openings of casings in small series may easily be provided with the necessary screening seal in an economic manner.

Special profiles, for example comprising undercuts, recesses etc., on the casing, are advantageously produced by guiding the needle or nozzle several times at least over predetermined regions of the portion on which the screening profile is intended to be mounted, in order to produce a multi-layer screening profile, thereby forming an exactly predetermined profile section. In so doing, a profile with a given cross-section, as desired, may advantageously be produced in several successive stages, either one nozzle coating the respective area several times, or several nozzles successively applying different strands which combine to form the desired sealing shape.

In this way cross-sectional profiles may preferably be produced which have given elasticity properties and do not acquire said elasticity because of their compressibility but because of a bending deformation, as is the case in bent lip sections or hollow sections.

It is, particular, not necessary to provide each strand of the material with conductive inclusions since linear conductors already provide a great screening effect due to the laws of the electromagnetic field.

The inventive measures also make it possible to produce complicated seal constructions with dimensions which vary along their extent, without special difficulties. Here, according to the relevant requirements, the cross-section may vary along the edge to be sealed, within wide limits. It is also possible to produce such constructions of screening profiles which are interconnected in a way that an individual production and mounting thereof, separate from the casing, would not have been possible. Any joints in the extent of the screening seal are thus obviated by the measures according to the invention so that the sealing effect is not interrupted.

Smaller casing zones or additions which are not made of metal or metallised, which would produce a break in the closed screen, may, in an operation carried out at the same time as the other seal is produced, be coated grid-like with the profile strands according to the invention, so that homogenous screening conditions also exist in such regions.

In this way elements of a Faraday cage may even be formed from tracks of conductive plastics material and thus of the sealing compound itself, if they are mounted in the shape of a grid in a plane and conductively connected at the intersections of the grid.

Due to the fact that different elastic materials are applied when guiding the needle or nozzle several times over the predetermined regions, at least one application comprising conductive material, it is possible to produce casings with seals whose conductive, corrosive and elastic properties have been optimised to advantage.

Casings allowing easier handling may be produced especially in such a way that the elastic conductive material is applied, by computer control, directly onto the edge region of a closable aperture of the casing so that the screening seal assumes a configuration enabling an easy opening and closing of the aperture.

In order to apply the screening profiles according to the invention, computer-controlled handling appliances may be used which allow a three-dimensional guidance of the needle or nozzle, a fourth variable relating to the metering of the still liquid or pasty material, as a function of the forward movement. By means of a fifth control variable it is additionally possible to select a material, i.e. various strands of material which may also be of a different composition and may be applied alternatingly, or simultaneously in "one single operation", so that the material characteristics of the entire section, with regard to its cross-section or its extent, may be varied locally. These varying characteristics include the conductivity, elasticity (bendability or compressibility) and/or hardening or adhesive properties of the material. A firm closure through adhesion can also be achieved by means of the screening sealing elements, if adjacent material strands have corresponding characteristics, e.g. if they are the two components of a two-component adhesive.

In other advantageous embodiments of the invention, instead of parts of the casing, parts of printed circuit boards projecting beyond the outer surface of the appliance may also take over screening functions, and for adaption to adjacent screening members may be provided with the features according to the invention.

Other advantageous further developments of the invention are characterised in the sub claims and are hereinafter more fully explained in the description of preferred embodiments of the invention, with reference to the Figures.

BRIEF DESCRIPTION OF THE DRAWINGS

FIGS. 2a to 2j schematic, partial cross-sectional diagrams of screening profiles which are part of embodiments of the casing according to the invention and may be produced using embodiments of the process according to the invention.

DESCRIPTION OF THE PREFERRED EMBODIMENTS

Figure 1:
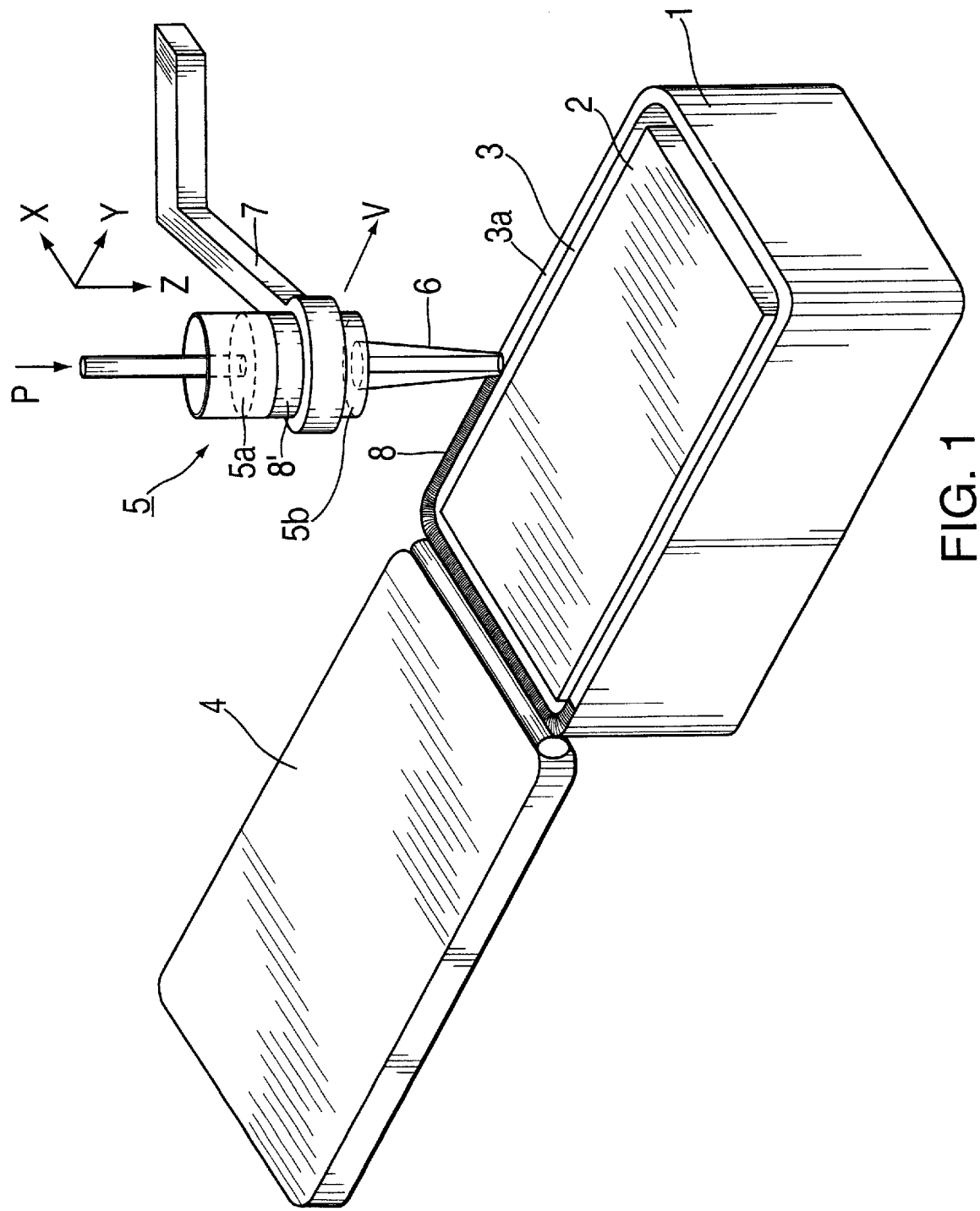
FIG. 1 a basic diagram of an embodiment of the process according to the invention.

FIG. 1 shows an aluminum screening casing 1 for an electronic circuit component 2, which has a cavity 3 for inserting the circuit component, said cavity being closed with a lid 4 after the insertion of the component.

FIG. 1 also shows how a screening profile 8 is applied to the edges of the cavity 3 by an application needle 6 airtightly connected to a piston-cylinder device 5, said application needle being guided, together with the piston-cylinder device 5, by a computer-controlled robot arm 7 which exerts a pressure p onto the piston 5a of the device 5, at a small and precisely maintained spacing from the casing 1, and at the speed v, along the surrounding edge 3a. The automatic arm may be guided in the three spatial directions x, y and z.

Cylinder 5b of device 5 is filled with a quickly air- and room-temperature-drying silicone polymer 8' at ambient temperature with included metal particles, which, as a result of the pressure exerted onto the pistons 5a, is pressed ("dispensed") through the channel 6a of the needle 6 onto the surface of the casing, to which it adheres and where it hardens under the influence of air, to form the elastic screening profile 8.

The cross-sectional dimensions and shape of the screening profile 8 are primarily determined by the physico-chemical-properties of the conductive plastics material used, more particularly the hardening speed, viscosity, surface tension with regard to the casing material, and the thixotropy thereof, as well as by the cross section of the channels, the pressure exerted onto the piston, the speed of the needle movement and by the environmental influences such as temperature or air humidity at the manufacturing site and may be predetermined by a suitable selection of said parameters.

In the casing 1, shown in FIG. 1, comprising a flap cover 4 mounted on one side to a hinge, it may be of advantage if the application needle 6 is guided along one edge portion of the opening 3 at a higher speed than in the other portions. A profile with a smaller cross section than that in the other edge portions would be formed here and the lid could be closed more easily.

It is possible to adjust the characteristics of the plastics material, particularly by adding fillers (carbon or the like), metal binders, surfactants and hardening catalysts or cross-linking agents.

The kind and grain size of the admixture ensuring conductivity, such as carbon, silver, silver- or gold-coated copper particles or the like, not only influence the electrical but also the mechanical and processing properties of the conductive elastic material.

FIGS. 2a to j show examples of different profile cross-sections for casings which may be manufactured in several applicational steps using the process according to the invention. It is, however, apparent when using the measures according to invention, that the cross-sections may also vary in the longitudinal direction of the profiles, in the geometrical dimensions and material characteristics thereof.

FIGS. 2a to 2d show a combination of conductive, less elastic sealing parts (hatched) and non-conductive sealing parts which are more elastic because of the missing metal admixture, thereby achieving a combined optimal effect of sealing and screening.

FIG. 2a shows a screening and sealing construction formed by profiles 81a and 81b with a substantially circular cross section, arranged side by side in two applicational steps on the surface of a casing part 11. Such a structure is produced, when the elastic material slightly wets the surface of the casing.

FIG. 2b shows a profile structure produced in three steps, consisting of a flat-domed, broad conductive profile part 82a and a conductive part 82c "dispensed" thereon and a non-conductive part 82b on a casing portion 12, the parts 82b and 82c having a substantially circular cross section.

Such a structure is obtained if a material of the first profile part 82a wets the surface of the casing to a great extent and/or was applied with a relatively broad nozzle instead of the needle 6 shown in FIG. 1, whereas the material of parts 82b and 82c have a mild wetting tendency with respect to the surface of part 82a.

FIG. 2c shows a structure which is similar to that of FIG. 2b. Here, two approximately semi-circular, conductive screening profile parts 83b and 83c are arranged on either side of a nearly semi-circular, non-conductive, highly elastic sealing profile 83d centrally arranged on a lower, broad profile part 83a positioned on a casing surface 13.

This last profile shows great stability with respect to forces acting parallel to the casing surface, but it has a comparatively lower elasticity. It may, therefore, be particularly suitable for sliding closures.

By contrast, the profile shown in FIG. 2d, which consists of a semi-circular elastic, non-conductive profile part 84a pressed onto a casing surface 14, and a conductive coating 84b covering the surface of said profile part 84a, has extremely satisfactory elasticity properties.

A high wetting ability and satisfactory adhesion between the surfaces of the two materials are necessary for the manufacture of the profile which is very suitable for hinged covers, especially if there is a relatively great play between the closure and casing part, or if they, themselves, have a certain elasticity.

FIGS. 2e to 2i show screening profiles which consist exclusively of conductive material.

FIG. 2e shows a specially formed, single-part profile 85 positioned on a casing surface 15 which has two beads 85a and 85b connected by a flat path. Such a profile may be suitable for casings with hinged covers which have shaped edges.

FIG. 2f shows a semi-circular screening profile 86 on a casing surface 16 which consists of a plurality of circular profile strands, said screening profile, together with said casing surface, enclosing an air space 86a.

The effect of the profile, in co-operation with said "air chamber", ensures a high elasticity of the entire profile despite a comparatively unsatisfactory elasticity of its components.

FIG. 2g shows a lip-shaped screening profile 87 on a casing surface 17, which consists of a plurality of circular profile strands laid one on top of the other.

FIG. 2h shows a T-shaped profile 88, positioned on a casing surface 18 with a rectangular groove 18a, said profile engaging with a broad centre part 88a in the groove 18a and having a planar surface parallel to the casing surface 18 outside the groove 18a.

This screening profile has not only a material connection but also a positive connection with the casing surface which further increases the stability.

FIG. 2i shows a profile structure consisting of a block 89a with an approximately rectangular cross section and made of conductive, elastic material, and two flat-domed profile parts 89b and 89c arranged side by side on top of said block.

Because of its large cross section this profile structure is especially suitable as a screen with respect to strong fields, but because of the added-on sealing lips 89b and 89c it is also provided with sufficient elasticity.

It is obvious that other cross sections (almost of any kind) are possible depending on the requirements to be met.

For specific applications, a combination of prefabricated, inserted sealing profiles and of profiles produced according to the invention may also prove suitable.

Figure 2J:
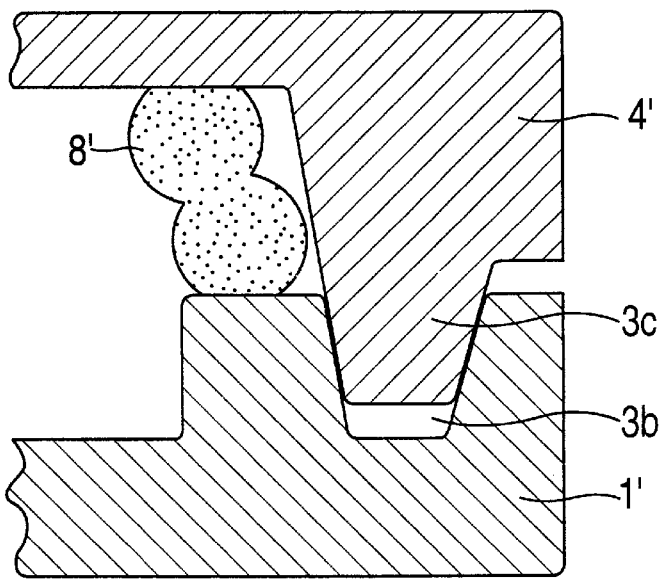

FIG. 2j shows a further embodiment of a casing provided with a sealing according to the invention in the region of an abutting edge. The casing consists of an upper part 4' which is provided with a surrounding tongue which engages in a corresponding surrounding groove 3b of the bottom part of the casing. The groove and tongue 3b and 3c taper, thus ensuring a relatively tight closure of the casing, but the mutual distance of the casing parts may vary because of manufacturing tolerances. The profile part 8' according to the invention therefore provides an additional screen within the region of the edge which, irrespective of the relative position of the two casing parts, is highly effective because of its elasticity and the incorporated conductive materials. Because of the inclination of its maximum cross sectional extent with respect to the direction in which the two casing parts close together, the elasticity is enhanced both by the compressibility and the flexural deformability of the profile part. In this way, any existing slight inhomogenieties in the sealing of the screen are reliably overcome because of the fit of the casing, and an excellent electromagnetic compatibility may, on the whole, be achieved.

Figure 3:
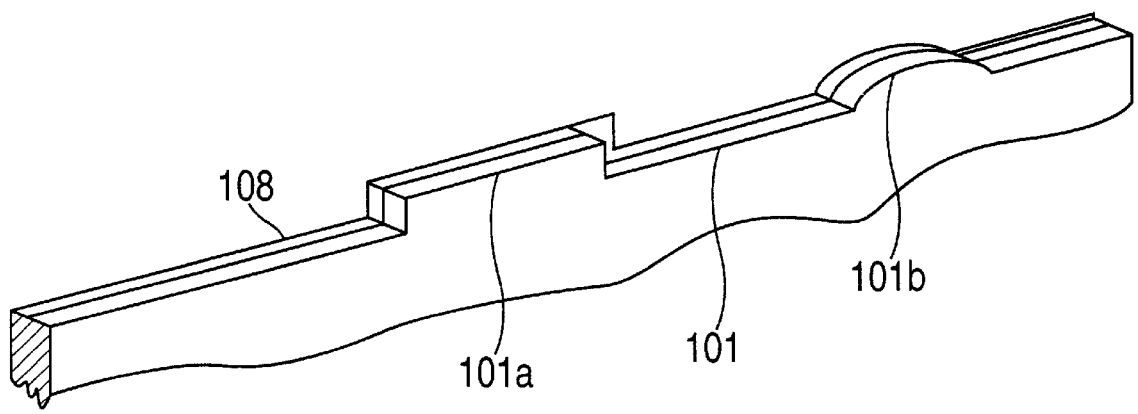
FIG. 3 a schematic diagram of the length of an edge with screening profile of a casing according to the invention, in one embodiment.

FIG. 3 shows, schematically, the length of a screening profile 108 along the edge of a casing 101, according to the invention, which has, by way of example, a rectangular edge projection 101a and a semi-circular curvature 101b. The process according to the invention enables the production of any sealing profile, as desired, so that screens of a high quality may be obtained.

The above description of casings and parts thereof also relates to components which act both as electrical and mechanical carriers and casings, for example a printed circuit board which is simultaneously used as a casing part.

Thus, the proposed solution also applies to profiles of covers in the form of a grid or basket provided in screening devices or parts thereof.

In its construction, the invention is not restricted to the above preferred embodiment. On the contrary, many variants are feasible which make use of the above solution even if they are basically of a different construction.

What is claimed is:

1. A method for the manufacture of a housing having two adjacent housing parts for accommodating electronic functional elements (2), comprising:

forming a screening seal (8; 8') to fill a gap between said two adjacent housing parts, said seal being made from an electrically conductive elastic plastic material, said electrically conductive elastic plastic material including a silicon polymer that dries rapidly in air and at ambient temperature, said forming including ejecting said polymer in a pasty initial state with a pressure nozzle and passing said pressure nozzle over one of said housing portions that is to be sealed, so that said polymer is deposited directly on said one of said housing portions (3a), to form said screening seal with a predetermined profile (8; 8') without a molding tool; and allowing said screening seal to cure on said one of said housing portions wherein said screening seal adheres to a surface of said one of said portions in such a manner that the screening seal maintains its electrical and sealing characteristics even after repeated opening of the housing.

2. The method according to claim 1, further comprising forming said screening seal by passing said nozzle several times at least over predetermined regions of said one of said portions to form said screening seal with said profile having a predetermined cross-section.

3. The method according to claim 2, wherein during said passing said nozzle repeatedly over the predetermined regions, different elastic materials are applied, at least one of said different elastic materials being a conductive material.

4. The method according to claim 2 wherein said forming of said screening seal is accomplished in several layers at least in some regions, each layer being formed directly on the layer lying beneath it.

5. The method according to claim 2 wherein said forming of said screening seal includes forming a first layer made of a material that is very elastic but is at most only slightly conductive and forming another layer made of another material which is only slightly elastic, but is very conductive.

6. The method according to claim 2 further comprising forming said predetermined profile of several strands of material, each said strand having a lip-shaped cross-section.

7. The method according to claim 2 further comprising forming said profile in several strands of material wherein said strands cooperate to form a hollow section.

8. The method of claim 2 further comprising forming said screening seal in several layers wherein at least one of said of layers is formed of a non-conductive material.

9. The method of claim 2 wherein one of said housing portions includes a printed circuit board, further comprising forming said screening seal with said printed circuit board.

10. The method of claim 2 further comprising forming said screening seal in several layers, some layers which differ in at least one of compressibility, elasticity, flexibility and hardness.

11. The method of claim 2 wherein said portions are mated in a tongue-and-groove arrangement further comprising forming said screening seal in parallel with said tongue-and-groove arrangement.

12. The method of claim 11 further comprising forming said screening seal inward of said tongue-and-groove arrangement.

13. The method of claim 1 further comprising ejecting said conductive elastic plastic material over one of said housing portions while simultaneously moving said nozzle along said one of said housing portion using computer control.

14. A method for the manufacture of a housing having two adjacent housing parts for accommodating electronic functional elements (2), comprising:

forming a screening seal (8; 8') to fill a gap between said two adjacent housing parts, said seal being made from an electrically conductive elastic plastic material, said electrically conductive elastic plastic material including a silicon polymer which hardens at room temperature that is applied at ambient temperature, said forming including ejecting said polymer in a pasty initial state with a pressure nozzle and passing said pressure nozzle over one of said housing portions that is to be sealed, so that said polymer is deposited directly on said one of said housing portions (3a), to form said screening seal with a predetermined profile (8; 8') without a molding tool; and allowing said screening seal to cure on said one of said housing portions wherein said screening seal adheres to a surface of said one of said portions in such a manner that the screening seal maintains its electrical and sealing characteristics even after repeated opening of the housing.

15. A method for the manufacture of a housing having two adjacent housing parts for accommodating electronic functional elements (2), comprising:

forming a screening seal (8; 8') to fill a gap between said two adjacent housing parts, said seal being made from an electrically conductive elastic plastic material, said electrically conductive elastic plastic material including a silicon polymer which becomes cross-linked and hardens at room temperature, said forming including ejecting said polymer in a pasty initial state with a pressure nozzle and passing said pressure nozzle over one of said housing portions that is to be sealed, so that said polymer is deposited directly on said one of said housing portions (3a), to form said screening seal with a predetermined profile (8; 8') without a molding tool; and allowing said screening seal to cure on said one of said housing portions wherein said screening seal adheres to a surface of said one of said portions in such a manner that the screening seal maintains its electrical and sealing characteristics even after repeated opening of the housing.

16. A method for the manufacture of a housing having two adjacent housing parts for accommodating electronic functional elements (2), one of said housing parts including an interior wall, comprising:

forming a screening seal (8; 8') to fill a gap between said interior wall and the adjacent housing part, said seal being made from an elastic and electrically conductive plastic material, said electrically conductive plastic material including a silicon polymer which hardens at room temperature, said forming including ejecting said polymer in a pasty initial state with a pressure nozzle and passing said pressure nozzle over said interior wall, so that said polymer is deposited directly on said interior wall, to form said screening seal with a predetermined profile (8; 8') without a molding tool; and allowing said screening seal to cure on said interior wall wherein said screening seal adheres to a surface of said interior wall in such a manner that the screening seal maintains its electrical and sealing characteristics even after repeated opening of the housing.

17. The method of claim 16 wherein said step of forming includes ejecting said polymer on a surface of said interior wall.

18. The method of claim 17 wherein said interior wall has a width and said step of forming includes forming said polymer into a bead on said interior wall approximately equal to said width.

* * * * *